United States Patent
Miller et al.

(10) Patent No.: US 8,577,662 B2
(45) Date of Patent: Nov. 5, 2013

(54) METHOD OF DETERMINING THE PARTICLE SENSITIVITY OF ELECTRONIC COMPONENTS

(75) Inventors: Florent Miller, Levallois (FR); Nadine Buard, Meudon (FR); Cecile Weulersse, Versailles (FR); Thierry Carriere, Triel sur Seine (FR); Patrick Heins, Castelnau de Montmiral (FR)

(73) Assignees: European Aeronautic Defence and Space Company EADS France (FR); Airbus Operations (S.A.S.) (FR); Astrium SAS (FR)

( * ) Notice: Subject to any disclaimer, the term of this patent is extended or adjusted under 35 U.S.C. 154(b) by 668 days.

(21) Appl. No.: 12/739,632

(22) PCT Filed: Oct. 23, 2008

(86) PCT No.: PCT/FR2008/051913
§ 371 (c)(1), (2), (4) Date: Jul. 12, 2010

(87) PCT Pub. No.: WO2009/056738
PCT Pub. Date: May 7, 2009

(65) Prior Publication Data
US 2012/0284006 A1    Nov. 8, 2012

(30) Foreign Application Priority Data

Oct. 26, 2007 (FR) .................................... 07 58621

(51) Int. Cl.
*G06F 17/50* (2006.01)
(52) U.S. Cl.
USPC .......................................................... 703/13
(58) Field of Classification Search
USPC ............................................................ 703/6
See application file for complete search history.

(56) References Cited

U.S. PATENT DOCUMENTS

| 4,786,865 A | 11/1988 | Arimura et al. |
| 4,878,179 A | 10/1989 | Larsen et al. |
| 2005/0192764 A1* | 9/2005 | Holland .......................... 702/28 |
| 2006/0049843 A1 | 3/2006 | Jenkins et al. |

FOREIGN PATENT DOCUMENTS

| EP | 0180780 A | 5/1986 |
| EP | 1231551 A | 8/2002 |
| WO | 2007119030 A | 10/2007 |

OTHER PUBLICATIONS

Dale McMorrow, Joseph S. Melinger, Stephen Buchner, Thomas Scott, Ronald D. Brown, Nadim F. Haddad, "Application of a Pulsed Laser for Evaluation and Optimization of SEU-Hard Designs" IEEE 2000, pp. 198-204.*
International Search Report and Written Opinion dated Apr. 6, 2009.

(Continued)

*Primary Examiner* — Dwin M Craig
(74) *Attorney, Agent, or Firm* — Perman & Green, LLP

(57) ABSTRACT

To analyze an electronic component, this component is exposed to a focused laser beam. The information provided by the laser mapping relating to the position and to the depth of the sensitivity zones of the component is used as input parameter in prediction codes for quantifying the sensitivity of the mapped component to ionizing particles in the natural radioactive environment. The prediction codes are used to determine the occurrence of malfunctions in the electronic component. Determination of the risks associated with the radiative environment imposes two aspects: one, probabilistic, takes into account the particle/matter interaction and the other, electrical, takes into account the charge collection inside the electronic component.

11 Claims, 2 Drawing Sheets

(56) References Cited

OTHER PUBLICATIONS

Leray J-L et al: "Atmospheric neutron effects in advanced microelectronics, standards and applications" Integrated Circuit Design and Technology, 2004, ICICDT '04. International Conference on Austin, TX, USA May 17-20, 2004, Piscataway, NJ, USA, IEEE, US, May 17, 2004, pp. 311-321, XP010726265. ISBN: 978-0-7803-8528-3.

Ann Garrison Darrin M et al: "The Impact of the Space Radiation Environment on Micro Electro Mechanical Systems (MEMS) and Microstructures" Radiation and Its Effects on Components and Systemsm, 2005. RADECS 200 5. 8th European Conference on, IEEE, PI, Sep. 1, 2005, pp. H1-1, XP031152666. ISBN: 978-0-7803-9501-5.

Bonanomi M et al: "A Model for TID Effects on Floating Gate Memory Cells" IEEE Transactions on Nuclear Science, IEEE Service Center, New York, NY, US, vol. 51, No. 6, Dec. 1, 2004, pp. 3753-3758, XP011123948. ISSN: 0018-9499.

\* cited by examiner

METHOD OF DETERMINING THE PARTICLE SENSITIVITY OF ELECTRONIC COMPONENTS

CROSS-REFERENCE TO RELATED APPLICATIONS

This application is the National Stage of International Application No. PCT/FR2008/051913 International Filing Date, 23 Oct. 2008, which designated the United States of America, and which International Application was published under PCT Article 21 (s) as WO Publication No. WO2009/056738 A1 and which claims priority from, and the benefit of, French Application No. 200758621 filed on 26 Oct. 2007, the disclosures of which are incorporated herein by reference in their entireties.

The aim of the aspects of the disclosed embodiments is to determine the sensitivity of electronic components to particles such as heavy ions, neutrons and protons through the joint use of a laser system and a malfunction prediction code based on the physics of particle/matter interaction.

BACKGROUND

Natural or artificial radiative environments (with neutrons, protons, heavy ions, flash x-rays, gamma rays) can disturb the working of electronic components. These disturbances are due to interaction between matter and the particles of the radiative environment. One consequence is the creation of parasitic currents in the component. The magnitude of the parasitic currents produced will vary according to the interactions between matter and particles. This results in the presence of localized charge collection areas in the component.

Such stresses created by heavy ions and protons are typically encountered in space by satellites and launchers. At lower altitudes in which aircraft move, stresses especially from neutrons can be noted. Such stresses may be encountered at sea level too and may affect electronic components embedded in portable apparatuses or in automobiles.

To be able to predict the behavior of components with respect to heavy ions, neutrons and protons especially for space and aeronautical applications, it is necessary to know the surface area of the charge accumulation zones as well as their position and dimension in depth. This presupposes the ability to create 3D mapping.

Classically, to assess the particle sensitivity of an electronic component to the particles of the radiative environment, the component is subjected to a stream of particles and the disturbances are accounted for. Inasmuch as the entire component is irradiated, this type of test does not allow for tracing back to the location of the charge collection zones. Furthermore, these tests are relatively costly because there are relatively few installations in the world capable of producing streams of particles. Finally, even if the nature of the particles coming from the particle accelerators is the same as that of the radiative environment, their energy may be different. This may lead to major errors, especially because of their lesser penetration into the component.

Small-sized beams may be extracted from the output of the particle accelerator. These microbeams can therefore be used to map the zones of sensitivity of a component. This mapping is done in a plane and reveals the location of the charge collection zones only superficially. No information on the location of the sensitive zone in depth is obtained by this type of test.

Until now, laser has been used chiefly as a tool for pre-characterising the sensitivity of the components to radiation. Just as with the particles of the radiative environment, laser can generate parasitic currents within the components when its wavelength is appropriate.

Laser has a very valuable advantage for studying the effect of radiation. Since the spatial resolution of a laser can reach relatively small dimensions as compared with the elementary structures contained in electronic components, it is possible, as in the case of a microbeam, to map an electronic component and identify its charge collection zones. By varying the focusing point of the beam in depth, it possible to map sensitivity in the third dimension too, and this can easily be done on an industrial scale. However, this knowledge is not sufficient to know the overall behavior of the electronic component under radiation.

SUMMARY

To overcome this problem, the disclosed embodiments have come up with the idea of working by simulation. Once the map of sensitivity of the component has been acquired, it is presented in the form of a model, in practice a matrix, having four or five dimensions, in an X Y Z referential frame with a coefficient of sensitivity or in an X Y Z T referential frame with a coefficient of sensitivity. This model of the component is then subjected to simulated stress and its simulated response is measured. For example schematically, if at a given instant T, a simulated ion (whether it is a primary ion or an ion produced by a nuclear reaction) passes through an elementary zone having X Y Z co-ordinates and, if at this instant, the elementary zone concerned has a sensitivity s, the zone is assigned the value of quality s. Then, this experiment is reiterated for another simulated ion. The process is continued in this way over a given period of study while, if the time varies as the case may be and if the application put into operation by the component runs on, the values s are collected and then for example at the end of a given period of measurement, the measured values of quality are compiled in order to find out the real quality of the component. Through this mode of action, a true measurement of quality is obtained rather than a mapping that is subject to conjecture.

According to the disclosed embodiments, the knowledge given by the laser mapping operations on the position and depth of the zones of sensitivity of an electronic component can be used as input parameters in prediction codes to quantify the sensitivity of the mapped electronic component to ionizing particles of the natural radiative environment. The prediction codes enable an assessment of the occurrence of malfunctioning in an electronic component. The assessment of risks related to the radiating environment dictates two aspects: the first aspect, which is probabilistic, takes account of a particle/matter interaction. The other aspect which is electrical takes account of the collection of charges within the electronic component.

This method is used to determine the sensitivity of electronic components to radiation through laser tests: the information on the geometry of the charge collection zones of the component then serve as input parameters in simulations of error prediction relative to the particles (heavy ions, neutrons, protons etc). The method of the disclosed embodiments highlights the weaknesses of a particular technology to radiation resistance. This is a major piece of information in developing new components from the viewpoint of manufacturing methods and for the choice of electronic components to be used in electronic systems so that they have the lowest sensitivity. In the disclosed embodiments, in the case of a study of sensitivity to neutrons or protons, rather than carrying out exhaustive simulations of nuclear reactions with the constituent nuclei of the electronic components, it is preferred to use a preliminarily built data base which, for an energy of stress from a given incident particle gives the characteristics of the products coming from the reactions as well as the probabilities associated with each of the possible reactions. In the case of heavy ions, the nuclear reactions are not studied and there is no data base because the heavy ions directly have high ionizing capacity. The simulation code enables the assessment, from criteria, of the effect that the interaction of these particles would have had on the working of the electronic component.

An aspect of the disclosed embodiments therefore is a method for characterising sensitivity to energy interactions of an electronic component in which:
- the electronic component is put into operation,
- the electronic component thus put into operation is excited by excitations produced by a laser radiation,
- a malfunction of the electronic component put into operation, corresponding to these excitations, is measured,
- a mapping is made of the sensitivity zones of the component in which these excitations have an effect,
- a program of simulation of stress applied by a particle prompting energy interactions is applied to the mapping of the sensitivity zones,
- this simulation program quantifies the sensitivity of the component on the basis of a large number of possible paths taken by the particles in the component and in the case of a neutrons and protons of a large number of reactions extracted from a data base.

BRIEF DESCRIPTION OF THE DRAWINGS

The disclosed embodiments will be understood more clearly from the following description and the accompanying figures. These figures are given purely by way of an indication and in no way restrict the scope of the disclosed embodiments. Of these figures.

DETAILED DESCRIPTION

Figure 1A:
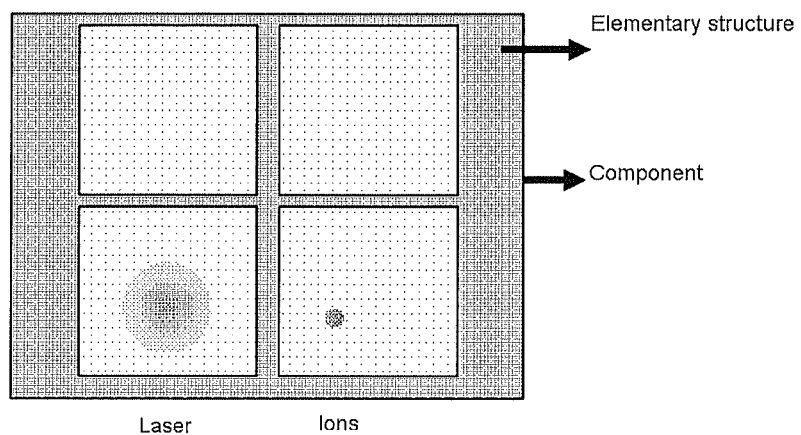
FIGS. 1a to 1c show three different cases of study for distinguishing the efficiency of the attack following a level of integration of the components.

According to the disclosed embodiments, a laser device makes it possible first of all to place an electronic component to be tested into operation, excite it by excitations produced by a laser ray and measure a malfunction of the electronic component put into operation corresponding to these excitations. This device thus makes it possible to set up a mapping of sensitivity zones of the component where these excitations have an effect. In one example, the laser source prompts an absorption of protons in the semiconductive material of the component.

The aspects of the disclosed embodiments are then based on the joint use of a laser system and a prediction code to compute the sensitivity of an electronic component to the natural radiating environment. The laser is used to map the sensitivity of the component to the localized injection of charges. A criterion is observed. This criterion takes account of the event studied. It can be an electrical signal which, when the event is activated, is different from the expected signal. In the case of a logic component such as a memory, it may be the value stored in a memory cell. For a linear component, it may be an analog signal of the component.

The system comprises:
- a laser source the wavelength of which enables the generation of charges in the semiconductive material considered (by a mechanism of linear or non-linear absorption);
- a device for the relative shifting of the laser relative to the component being tested along all three directions of space;
- possibly, an interface enabling communications between the component being tested and the system for controlling the laser
- a system for modifying laser energy;
- a system to ascertain that an event has or has not taken place.

A mapping of sensitivity of the component is performed in all three dimensions of space. It can also take account of time, thus adding another dimension. For each position, X Y Z of the mapping system and, as the case may be, for each instant t of the cycle of operation of the component or of the application executed by this component, a laser shot is made. This laser shot prompts the generation of charges within the semiconductor material. Under the influence especially of electrical fields and diffusion mechanisms, the charges start moving and create currents which can disturb the working of the electronic component. Not all the positions (spatial and temporal positions) of the mapping system will have the same sensitivity because spatially the physical parameters of the component are not the same depending on the position and, temporally, not all the zones of the component are acted upon in the same way in the course of time. Laser mapping makes it possible to highlight the zones of sensitivity of a component under localized generation of charges, i.e. to reveal variations in spatial sensitivity and possibly temporal sensitivity. These are zones sensitive to ionizing particles (directly or indirectly ionizing particles) such as heavy ions, neutrons and protons.

Laser mapping is used to identify:
1—the spatial position X Y Z of a zone of sensitivity;
2—the temporal position of a zone of sensitivity, i.e. the points in time at which a zone is seen to be sensitive to the injection of charges;
3—the shape and volume of this zone of sensitivity (which evolves as the case may be as a function of time);
4—the relative position of the zone of sensitivity relative to neighboring zones of sensitivity;
5—in the case of logic components and if necessary the logic function impacted during an injection of charges into the zone of sensitivity.

The pieces of information 4 and 5 extracted from the laser mapping depend on the technology, the conditions of use, as the case may be the application operated by the component. On the contrary, they do not depend on the rate at which the charges are deposited and are therefore valid whatever the charge deposit considered (whether particles or laser charge for example). The pieces of information 1, 2 and 3 extracted from the laser mapping process depend on the technology, the conditions of us and, as the case may be, the application made by the component. They also depend on the temporal rate (for 2) and spatial rate (for 1 and 3) of the charge deposit. In the case of 2, there are lasers having equivalent pulse durations equivalent to the duration of the deposit of charges of an ionizing particle in a semiconductor material (close to one picosecond) and in this case the information obtained is valid whatever the charge deposit considered (particles or laser for example).

Thus, the laser mapping makes it possible to obtain two different types of information. In the former case, laser mapping can be directly exploited to extract data on the sensitivity of the electronic components relative to particles of the radiation environment, in the cases 4 and 5.

In the second case, cases 1, 2 and 3, it is necessary to apply processing to the laser mapping to extract payload information to estimate the sensitivity of the electronic components relative to the particles, and this processing takes account of the specific nature of the particle/matter interaction.

With regard to the direct exploitation of laser mapping, namely cases 4 and 5, laser means can be used to identify the relative positions of the zones of sensitivity (and depending or not depending on time). The precision of this piece of information is not linked to the size of the spot but to the size of the pitch of movement used to obtain the laser mapping. In this sense, obtaining this piece of information on distance between sensitive zones is independent of the size of the beam considered.

For the most integrated components possessing a very fine periodic arrangement of elementary cells (such as memories), the geometrical information on distance between a cell and its nearest neighbors obtained through laser mapping also gives the maximum size of the zone of sensitivity of an elementary cell (since the entire cell is seen as being sensitive). This piece of information is obtained directly and can be exploited without processing.

Figure 1B:
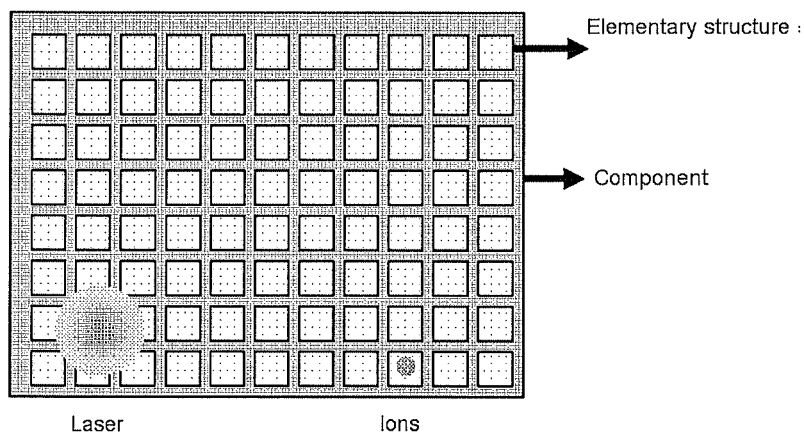
Figure 1C:
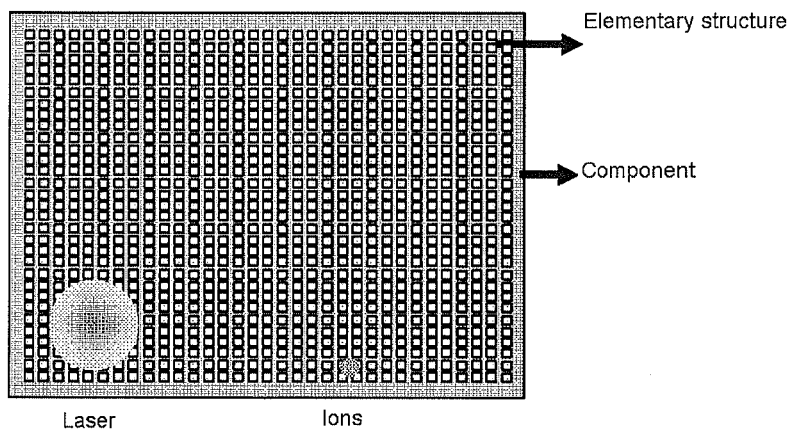

As regards the processing of laser mapping, in the second case identified, namely 1, 2 and 3, it is necessary to apply processing to laser mapping to extract payload information to estimate the sensitivity of the electronic components relative to the particles of the radiating environment. It is then necessary to distinguish between three different cases of studies depending on the level of integration of the component. These three cases are explained with reference to FIGS. 1a to 1c.

Case A: Less-integrated components for which the ionization trace of the laser and the ionization trace of a given energy ion have a size smaller than the characteristic dimensions of the elementary structures and/or the zones of sensitivity of the electronic component.

Case B: Integrated components for which the ionization trace of the laser is of a size greater than that of the characteristic dimensions of the elementary structures or the zones of sensitivity of the electronic component while the trace of ionization of a given energy ion is small-sized as compared with these structures.

Case C: Highly integrated components for which the ionization trace of the laser and the ionization trace of a given energy ion are of a size greater than the characteristic dimensions of the elementary structures or the zones of sensitivity of the electronic component.

In each of the cases, it is possible to process the data in order to know the zone of sensitivity relative to the ionizing particles (whether direct or indirect ionization).

In the first case A, the charge deposit obtained by a focused laser and the charge deposit obtained by an ion are highly localized relative to the elementary structures of the component. The zones identified as being sensitive by the laser will be also sensitive for the ions. The laser mapping therefore makes it possible in this case to directly identify spatially and/or temporally the zones that are sensitive to the passage of an ionizing particle (directly or indirectly).

In the second case B, the laser will over-estimate the size of the zone of sensitivity as compared with what was already detected as being sensitive by an ion. In other words, the zone of sensitivity detected by the laser appears to be a convolution of the real zone of sensitivity of the component with the size of the ionization trace generated by the laser. We then proceed to a mathematical de-convolution which is used to take the size of the laser spot into consideration for the extraction, from a laser mapping, of the estimated size of the zone of sensitivity of the component relative to ionizing particles. The mathematical de-convolution is an operation for retrieving the real zone of sensitivity of the component where the zone of sensitivity detected by the laser and the shape and size of the ionization trace of the laser are known. From the mathematical viewpoint, this can be expressed by the resolution of the following equation:

$$ZSlaser = f(ZSi)$$

where: ZSlaser is the zone of sensitivity identified by the laser, ZSi is the zone of sensitivity of the component relative to the particles and f is a function of the ionization trace of the laser.

The resolving of the equation consists in finding the function so f-1 that: ZSi=f-1 (ZSlaser) can be determined.

In the third case C, whether the deposit of charges is due to an ion or to a laser, its size is greater than the size of the elementary structure of the component. From the viewpoint of this elementary structure, the charge deposit due to an ion or to a laser is almost the same because the charges are created throughout the elementary structure. In this case, it is easy to make the correlation in order pass from information on sensitivity obtained by laser to expected information on sensitivity relative to ionizing particles since the entire elementary structure in this case is sensitive. The zones of sensitivity associated with the elementary structures and detected by laser and by ion are directly linked to the size of the ionizing traces of the laser and of the ion respectively.

The localizing of the sensitivity zones in depth is determined by causing the focusing point of the laser beam to vary either by changing the focal length or by shifting the focused laser in depth relative to the component.

Thus, the laser makes it possible to send back geometrical information on the position and size of the zones of sensitivity of the electronic components relative to ionizing particles. As the case may be, in case B, there will be withdrawal or no withdrawal. Subsequently, to quantify the sensitivity of the electronic components relative to ionizing particles, it is necessary to couple these pieces of geometrical information with a prediction code as described further below.

In order to assess the sensitivity of a given electronic component in a given radiation environment (space or avionic environment), many prediction tools have been developed, among them SMC DASIE (Simplified Monte-Carlo Detailed Analysis of Secondary Ion Effects). This method has been described in G. Hubert et al "A review of DASIE codes family: contribution to SEU/MBU understanding" in "11th IEEE International On-Line Testing Symposium", 2005. The various versions of this code are based on the same principle of exploitation of nuclear data bases coupled with charge collection modules and criteria for activating effects. The laser enables the extraction of data on method and sensitivity through localized injection of charges for a particular component with a technology unknown at the outset. These Monte-Carlo computation tools rely on the random drawing of a large number of interactions reproducing the conditions of ionizing traces possible, following heavy ion interaction or to neutron or proton nuclear reactions with nuclei constituting the component. They therefore compute error frequency (SER or Single Event Rate).

Certain Monte-Carlo prediction codes can be used to take account of a large number of elementary cells and hence to process the problems related to multiple effects that appear simultaneously in different cells of the component.

The setting up of a Monte-Carlo method consists in managing three sets of issues and problems:

1—Management of the Monte-Carlo draw of interactions as a function of the environment considered;

2—Physics of particle/matter interaction (data bases): knowledge of the characteristics of the primary ions or of the secondary ions produced by the neutron or proton reactions with the constituent nuclei of the components;

3—Error criterion: determining the collection of the charges and their consequence.

To study the singular effects induced in electronic components by atmospheric neutrons or protons of radiation belts, it is necessary to know the ionizing products (known as secondary ions, recoil nuclei, spallation fragments or products) which these nucleons prompt with the atoms of the target.

Figure 2:
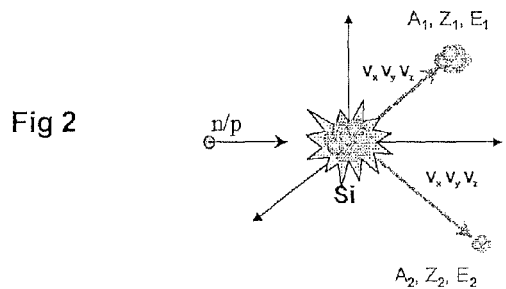
FIG. 2 shows the symbolic content of a data base which gives a detailed description of the products created during a nuclear reaction for an incident particle of given energy and the probability associated with this reaction.

Given the energy extent or range (1 MeV to 1 GeV) of the different types of interaction (elastic, non-elastic etc), different codes have been used to generate data bases in order to describe the different mechanisms of interaction according to their specificities, i.e. types of reactions and energies. Dedicated computation codes such as the HETC, MC-RED, MC-Recoil, GEANT4, GNASH, or MCNP 6 (depending on the energy of the incident particles) or data bases of the interaction such as ENDF or JENDL can be used. Most of these nuclear codes are accessible through the Internet. The principle of the interaction of a neutron n or a proton p with a target nucleus is symbolized in FIG. 2.

For neutron/proton energy levels below 10 MeV, the elastic reactions are preponderant. Conversely, for energy levels above 50 MeV, reactions of the non-elastic type are in the majority. The elastic type reactions are those inducing energy from the incident n/p and a recoil ion (conservation of kinetic energy and of the mass number). The non-elastic reactions are varied; each reaction is characterized by an energy appearance threshold. These reactions induce the generation of one or more secondary ions.

The data bases process the neutron/matter or proton/matter interactions and are formed, for each incident energy value, by hundreds of thousands of non-elastic and elastic nuclear events with the detail of the nuclear reactions, i.e. the nuclear numbers and mass numbers of the secondary ions, their energy values and their sending characteristics (sending angles).

Figure 3:
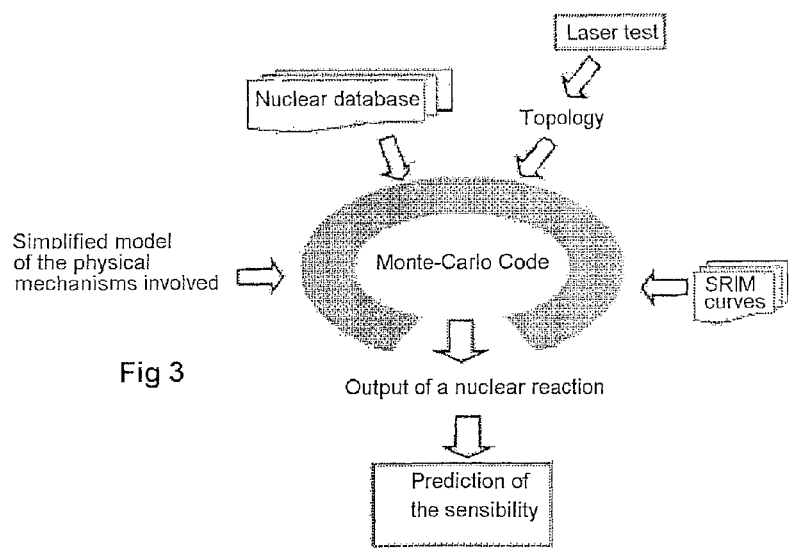
FIG. 3 shows the general principle of a Monte-Carlo code for predicting the sensitivity of electronic components.

The general principle of a Monte-Carlo code for the prediction of sensitivity of electronic components is illustrated in FIG. 3. The method is that of obtaining a set of random draws of nuclear reactions associated with a draw of their location in the component. The making of this set of draws is likened to a duration of experiment. For each of these configurations, an analysis based on a simplified model of the study of the physical charge collection mechanisms makes it possible to decide on the occurrence of an error induced by secondary ions having such a characteristic. In the case of the study of heavy ions, the method remains identical but there is no random drawing of nuclear reactions since it is only one primary particle that is studied.

As the case may be, these simulation codes take account of the size of the ionization trace of the charged particles. Instead of depositing the charge at only one point, a radial distribution of the charge is introduced.

The simplification of the physical module is obtained through the study of a large number of constituent simulations. These simulations make it possible, for a given and preliminarily meshed structure, to resolve the equations of the semiconductor for each meshing point of the structure and also for each instant of the time domain studied. These simulations enable a very precise study of the behavior that an electronic component will have relative to an ionizing interaction. However, these simulations are very costly in computation time. For this reason, in the context of the disclosed embodiments, it is necessary to simplify the method for simulating the cases of dysfunctioning studied. It is through the preliminary study of a large number of constituent simulations that it is possible to identify the parameters influencing the appearance of the error and define the simplified modules of the physical mechanisms brought into play which will be implemented in the prediction tool.

Thus for example, and without thereby restricting the type of component to which the disclosed embodiments can be applied, it is known especially that, in the case of a switching of an SRAM cell, its sensitivity is characterized by the critical LET parameter (defined as the loss of energy per path unit) or critical charge. For an error to be prompted, the ion or ions generated by the nuclear reaction must deposit sufficient energy in the drains of the transistors in the OFF state. Component simulations have shown that conditions favorable to the creation of an error make its trace pass fairly close to one of the sensitive zones, or else goes through it so as to induce therein a parasitic current or a collection of charges sufficient to create a switching. Simple diffusion-collection models (especially analytical models) based on ambipolar diffusion of the carriers and the collection of the charges at the blocked drains make it possible to describe the shifting of the carriers.

Various methods can be used to assess whether or not the dysfunctioning that follows the passage of an ion has occurred. The first method entails a simplified approach (of the first order). It is based on the determining of the charge deposited by the ion in the sensitive volume of the elementary cell and of the comparison of this cell with a threshold switching value.

Figure 4A:
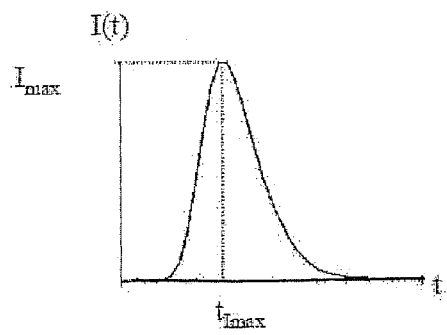
FIGS. 4a and 4b provide a time-based representation of the collection of carriers deposited by the passage of an ion and the principle of a criterion (Imax, tImax) of SEU for a 0.6 μm technology.

The second method is a finer study of the phenomenon (second order phenomenon). In FIG. 4a, the collection of the carriers deposited by the passage of the ion is studied temporally in order to rebuild the current. The temporal progress of the current is used to determine whether or not a switching is occurring. For example the dynamic criterion (Imax, tImax) introduces a borderline curve separating the pairs (Imax, tImax) inducing switchings also called SEU (Single Event Upsets) from those which do not induce any such switching. Starting from the observation that all the passages of particles induce currents which have the same shape i.e. prompt growth followed by slow decrease, each passage of an ion can be characterized by the pair constituting a maximum amplitude of the current (Imax) and the time at which it is set up (tImax).

Figure 4B:
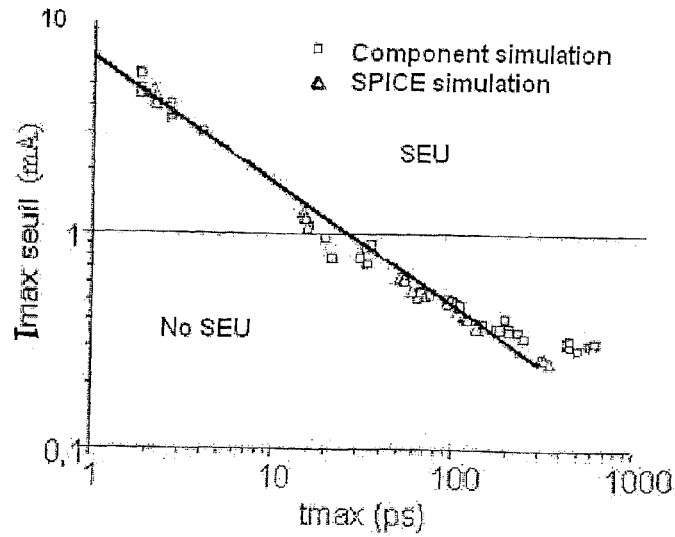

FIG. 4b shows the example of the principle of the dynamic criterion (Imax, tImax) to study the sensitivity to SEUs for a 0.6 µm technology. To measure the malfunction of the component, we measure the progress in time of the current resulting from the excitation. The criterion (Imax, tImax) of this current makes it possible to decide on the switching of the logic state of the component.

The above-mentioned examples pertain to the study of the SEU mechanism in an SRAM memory cell but one aspect of the disclosed embodiments can be applied to any type of electronic component and any type of effect induced by radiation provided that the criterion of the effect induced by radiation is identified (since a same criterion can be common to several effects induced by the radiation).

In addition to the nuclear data base described here above, curves are provided by a computation code (such as for example the SRIM tool accessible through the Internet) describing the behavior of the energy deposit of the secondary ions or the heavy ions during their passage into the material. The data base and the SRIM curves are fixed whatever the type of errors studied but depend on materials which constitute the electronic component. The technological inputs needed for the computation code are the information on the topology of the component (i.e. the volume of the sensitive zones and the distance between two sensitive zones). These parameters vary according to the component and the type of errors studied.

The inputs needed to predict sensitivity of an electronic component are: the dimensions of an elementary cell, the dimension and position of the sensitive volume of a cell associated with the desired phenomenon and the positions of the neighboring sensitivity zones. The laser tool is used to obtain this information. The coupling between the prediction tool and the laser mapping makes it possible therefore to quantify the sensitivity and quality of the electronic components. The processing if any of the information obtained by the laser mapping depends on the level of integration of the component relative to the sizes of the laser spot and the ionization traces of the particles brought into play. This geometrical data is used at input of the prediction codes to quantify the sensitivity of an electronic component relative to the particles of the natural radiating environment.

The invention claimed is:

1. A method for characterising the sensitivity to energy interactions of an electronic component, comprising:
    the electronic component is put into operation,
    the electronic component thus put into operation is excited by excitations produced by a laser radiation,
    a malfunction of the electronic component Put into operation, corresponding to these excitations, is measured,
    a mapping is made of the sensitivity zones of the component in which these excitations have an effect,
    a program of simulation of stress applied by a particle prompting energy interactions is applied to the mapping of the sensitivity zones,
    this simulation program produces a large number of possible paths taken by the particles in the component and, in the case of a neutrons and protons, a large number of reactions extracted from a data base,
    this simulation program implements a charge collection model from these possible paths and from the mapping of the sensitivity of the component,
    this simulation program analyzes these charge collections and decides on the occurrence of errors related to these charge collections,
    the quality signal of the component is deduced from this analysis and from these decisions.
    a data base is used, in the case of the neutrons and the protons, providing information on products and probabilities of possible nuclear reactions, and
    the effect of the ionization on the working of the components is measured.

2. The method of claim 1, wherein
a processing is applied to the prepared laser mapping to extract a mapping, this mapping taking account of the sensitivity of the component to the ionizing particles.

3. The method of claim 2, wherein
a mathematical deconvolution is performed to take into consideration a size of a laser impact relative to an estimated size of a zone of sensitivity of the component to ionizing particles.

4. The method of claim 3, wherein
for components with fine integration, a maximum size of the zone of sensitivity of an elementary cell is measured with the laser mapping.

5. The method of claim 4, wherein
to quantify the sensitivity of the component, a response is measured of the electronic component to excitations according to criteria determined for the dysfunction studied.

6. The method of claim 5, wherein
the simulation program chooses nuclear reactions from a data base corresponding to the type and energy of the particle studied.

7. The method of claim 6, wherein
as a measurement of energy interaction, interactions of heavy ions and/or of protons and/or of neutrons are measured by laser simulation.

8. The method of claim 7, wherein
the energy of the laser photon of the laser source is greater than the value of the bandgap of the semiconductor component.

9. The method of claim 8, wherein
the laser source prompts a simultaneous absorption of several photons in the semiconductor material.

10. The method of claim 9, wherein
the laser mapping is done in all three dimensions of space.

11. The method of claim 10, wherein
the laser mapping is done in four dimensions, the three dimensions of space as well as time.

* * * * *

UNITED STATES PATENT AND TRADEMARK OFFICE
CERTIFICATE OF CORRECTION

PATENT NO. : 8,577,662 B2  
APPLICATION NO. : 12/739632  
DATED : November 5, 2013  
INVENTOR(S) : Miller et al.

Page 1 of 1

It is certified that error appears in the above-identified patent and that said Letters Patent is hereby corrected as shown below:

In the Claims

Column 9, line 36, Claim 1, delete "Put" and insert -- put --, therefor.

Column 10, line 5, Claim 1, delete "decisions." and insert -- decisions, --, therefor.

Signed and Sealed this  
Fourth Day of March, 2014

Michelle K. Lee  
*Deputy Director of the United States Patent and Trademark Office*